(12) United States Patent
Sung et al.

(10) Patent No.: US 12,159,824 B2
(45) Date of Patent: Dec. 3, 2024

(54) 3D PACKAGE CONFIGURATION

(71) Applicant: CCS Technology Corporation, Taoyuan (TW)

(72) Inventors: Tung-Po Sung, Taoyuan (TW); Chang-Cheng Lo, Taoyuan (TW)

(73) Assignee: CCS Technology Corporation, Taoyuan (TW)

( * ) Notice: Subject to any disclaimer, the term of this patent is extended or adjusted under 35 U.S.C. 154(b) by 416 days.

(21) Appl. No.: 17/678,193

(22) Filed: Feb. 23, 2022

(65) Prior Publication Data

US 2022/0199497 A1 Jun. 23, 2022

Related U.S. Application Data

(63) Continuation-in-part of application No. 17/158,080, filed on Jan. 26, 2021, now Pat. No. 11,373,983.

(30) Foreign Application Priority Data

Dec. 23, 2020 (TW) .................................. 109145694

(51) Int. Cl.
| | |
|---|---|
| *H01L 23/498* | (2006.01) |
| *H01L 23/00* | (2006.01) |
| *H01L 23/538* | (2006.01) |
| *H01L 25/065* | (2023.01) |
| *H05K 1/02* | (2006.01) |
| *H05K 1/18* | (2006.01) |

(52) U.S. Cl.
CPC ...... *H01L 23/4985* (2013.01); *H01L 23/5386* (2013.01); *H01L 24/16* (2013.01); *H01L 25/0655* (2013.01); *H01L 25/0657* (2013.01); *H05K 1/028* (2013.01); *H05K 1/189* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 5,776,797 | A * | 7/1998 | Nicewarner, Jr. ... | H01L 25/0657 438/109 |
| 6,121,676 | A * | 9/2000 | Solberg ............... | H01L 23/5387 257/725 |
| 6,225,688 | B1 * | 5/2001 | Kim ..................... | H01L 23/5387 257/725 |
| 6,699,730 | B2 * | 3/2004 | Kim ..................... | H01L 25/0657 438/109 |
| 7,875,974 | B2 * | 1/2011 | Gokan ................ | H01L 25/0657 257/730 |
| 11,218,583 | B2 * | 1/2022 | Lee ...................... | H01Q 1/2283 |
| 2001/0006252 | A1 * | 7/2001 | Kim ..................... | H01L 25/0657 257/688 |

(Continued)

*Primary Examiner* — Long Pham

(57) ABSTRACT

A novel 3D package configuration is provided by stacking a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies of various functions be bonded on one die and/or two side of a flexible circuit board and electrically connected therewith in advance.

6 Claims, 6 Drawing Sheets

(56) References Cited

U.S. PATENT DOCUMENTS

2006/0286717 A1* 12/2006 Solberg .............. H01L 23/5387
　　　　　　　　　　　　　　　　　　　　257/E25.023
2012/0261814 A1* 10/2012 Slavov ................ H01L 25/0657
　　　　　　　　　　　　　　　　　　　　257/737

* cited by examiner

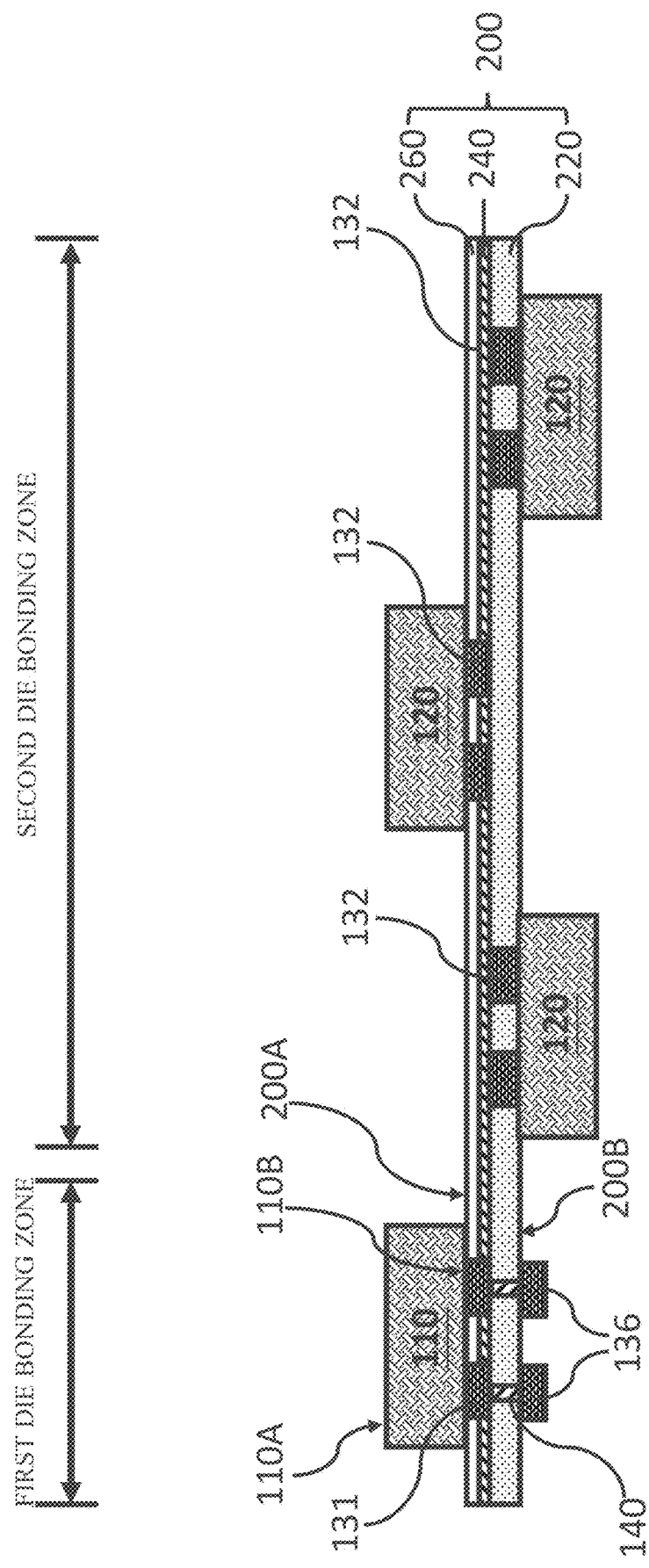
FIG. 1A"

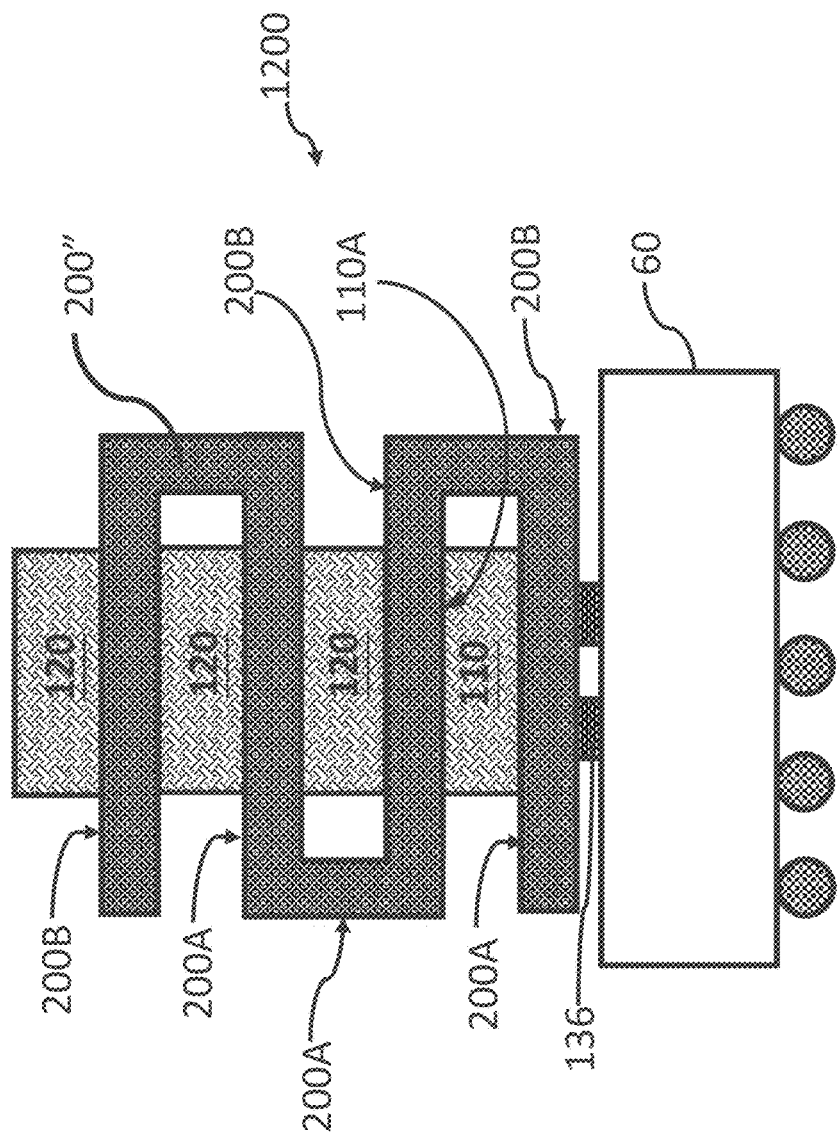
FIG. 1B"

3D PACKAGE CONFIGURATION

CROSS-REFERENCE TO RELATED APPLICATION

This application is a continuation-in-part (CIP) application of, claims priority to and the benefit of, U.S. patent application Ser. No. 17/158,080 filed on Jan. 26, 2021 and entitled "3D PACKAGE CONFIGURATION", which claims the priority benefit of Taiwanese Application Serial Number 109145694, filed on Dec. 23, 2020, which is incorporated herein by reference.

TECHNICAL FILED

This invention relates to a package configuration, and particularly relates to a 3D package configuration.

BACKGROUND OF THE INVENTION

The application of 3D package configurations is rapidly developing to solve important technical issues such as miniaturization, multi-function integration, faster interconnection, and energy saving. A typical 3D package configuration usually obtained by stacking dies with through-silicon vias (TSV) or dies interconnected by micro-bumps and electrically connected to each other by micro-bumps.

However, the above-mentioned 3D package configurations usually involve thin film deposition, photolithography, development, etching, metallization and other semiconductor manufacturing processes, which are not only complicated in process and time-wasting in packaging, but also low yield rate and high cost. In view of these disadvantages, a novel 3D package configuration that can be manufactured by conventional techniques is highly expected by the industry.

SUMMARY OF THE INVENTION

This invention discloses a 3D package configuration, comprising: a package substrate; and a folded flexible circuit board structure vertically stacked on the package substrate and electrically connected therewith through package substrate bonding pads thereof, comprising: a folded flexible circuit board formed by folding a strip-shaped flexible circuit board, wherein the strip-shaped flexible circuit board comprises a first surface and a second surface opposite to each other, and the strip-shaped flexible circuit board has a first die bonding zone and at least one second die bonding zone; at least one first semiconductor die bonded to the first die bonding zone and electrically connected to the strip-shaped flexible circuit board; and at least one second semiconductor die bonded to the at least one second die bonding zone and electrically connected to the strip-shaped flexible circuit board; wherein, the at least one second semiconductor die is vertically stacked above the at least one first semiconductor die.

The above-mentioned 3D package configuration comprises a plurality of second semiconductor dies spaced with each other, and a plurality of second die bonding zones formed on the first surface and/or the second surface of the strip-shaped flexible circuit board, wherein each of the second semiconductor dies is bonded on each of the second semiconductor die bonding zones and electrically connected to the strip-shaped flexible circuit board through second die bonding pads in each of the second die bonding zones, and the second semiconductor die are vertically and sequentially stacked above the at least one first semiconductor die, and the first die bonding zone overlaps with the second die bonding zones.

The above-mentioned 3D package configuration, wherein the second die bonding zones are concurrently formed on the first surface of the strip-shaped flexible circuit board or concurrently formed on the second surface of the strip-shaped flexible circuit board.

The above-mentioned 3D package configuration, wherein the second die bonding zones are alternatively formed on the first surface and the second surface of the strip-shaped flexible circuit board.

The above-mentioned 3D package configuration, wherein the strip-shaped flexible circuit board comprises: a strip-shaped flexible insulating substrate; a circuit formed on a surface of the strip-shaped flexible insulating substrate; and a strip-shaped insulating layer overlaying the circuit; wherein, the first die bonding zone comprises a plurality of first die bonding pads electrically connected to the circuit to make the first semiconductor die electrically connected to the circuit through the first die bonding pads, and the at least one second die bonding zone comprises a plurality of second die bonding pads electrically connected to the circuit to make the at least one second semiconductor die electrically connected to the circuit through the second die bonding pads, and a plurality of package substrate bonding pads under the first die bonding zone are formed on the second surface of the strip-shaped flexible circuit board, and each of the package substrate bonding pads is electrically connected to each of the first die bonding pads corresponding thereof through a conductive hole.

The above-mentioned 3D package configuration, wherein the material of the strip-shaped flexible insulating substrate is selected from one of the group consisting of Polyester resin, Polyimide (PI), Modified Polyimide (MPI), Covalent Organic Framework (COF), Liquid Photo-Imagable (LPI), Liquid Crystal Polymer (LCP), Polytetrafluoroethylene (PTFE) and flexible epoxy bonded fiber-glass board, or combinations thereof.

The above-mentioned 3D package configuration, wherein the material of the circuit is selected from one of the group consisting of copper, copper alloy, tinned copper, tin alloy, aluminum, aluminum alloys, gold and silver, or combinations thereof.

BRIEF DESCRIPTION OF THE DRAWINGS

FIGS. 1A'~1B' are cross-sectional views showing processes for manufacturing another 3D package configuration 1600 according to Embodiment of this present invention.

FIGS. 1A"~1B" are cross-sectional views showing processes for manufacturing another 3D package configuration 1700 according to Embodiment of this present invention.

DETAILED DESCRIPTION OF THE INVENTION

In the following detailed description, for purposes of explanation, numerous specific details are set forth in order to provide a thorough understanding of the disclosed Embodiment. It will be apparent, however, that one or more Embodiments may be practiced without these specific details.

It is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

Embodiment

Figure 1A:
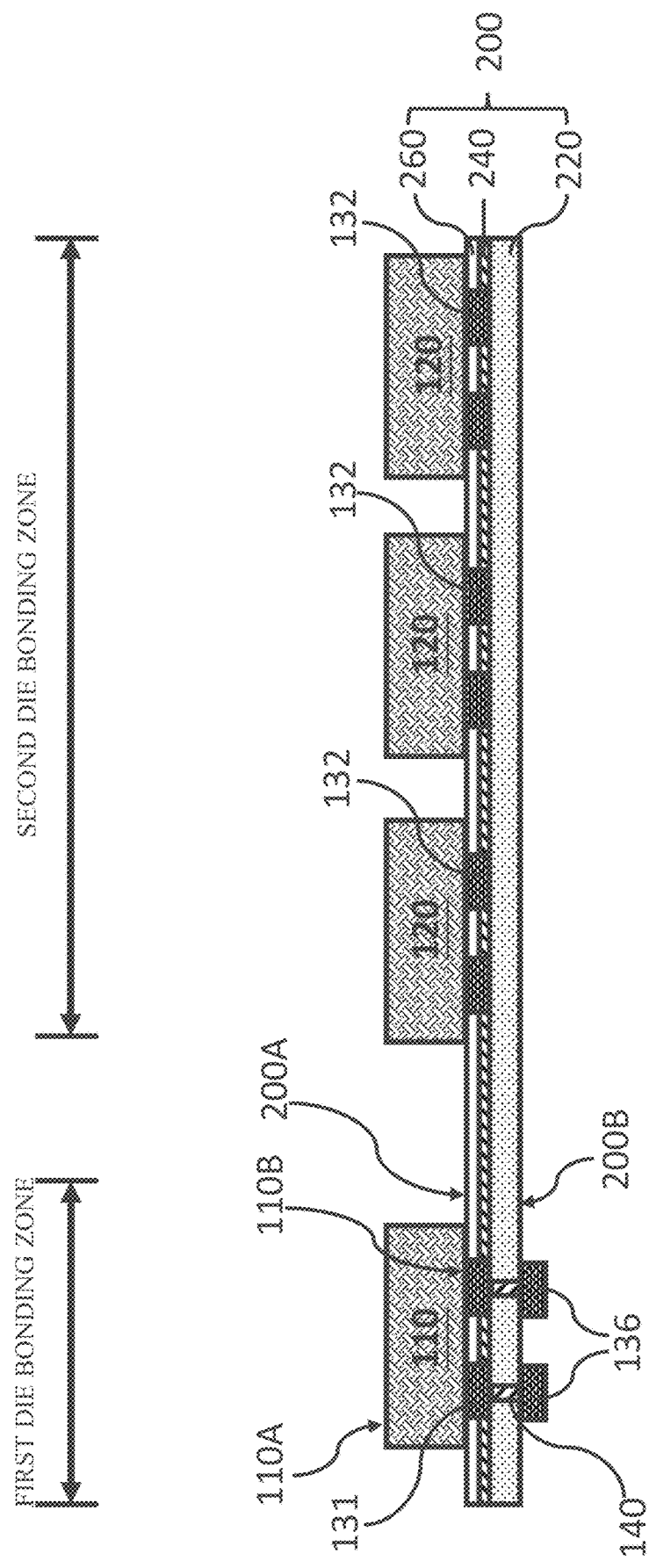
FIGS. 1A~1B are cross-sectional views showing processes for manufacturing a 3D package configuration 1500 according to Embodiment of this present invention.
Figure 1A:
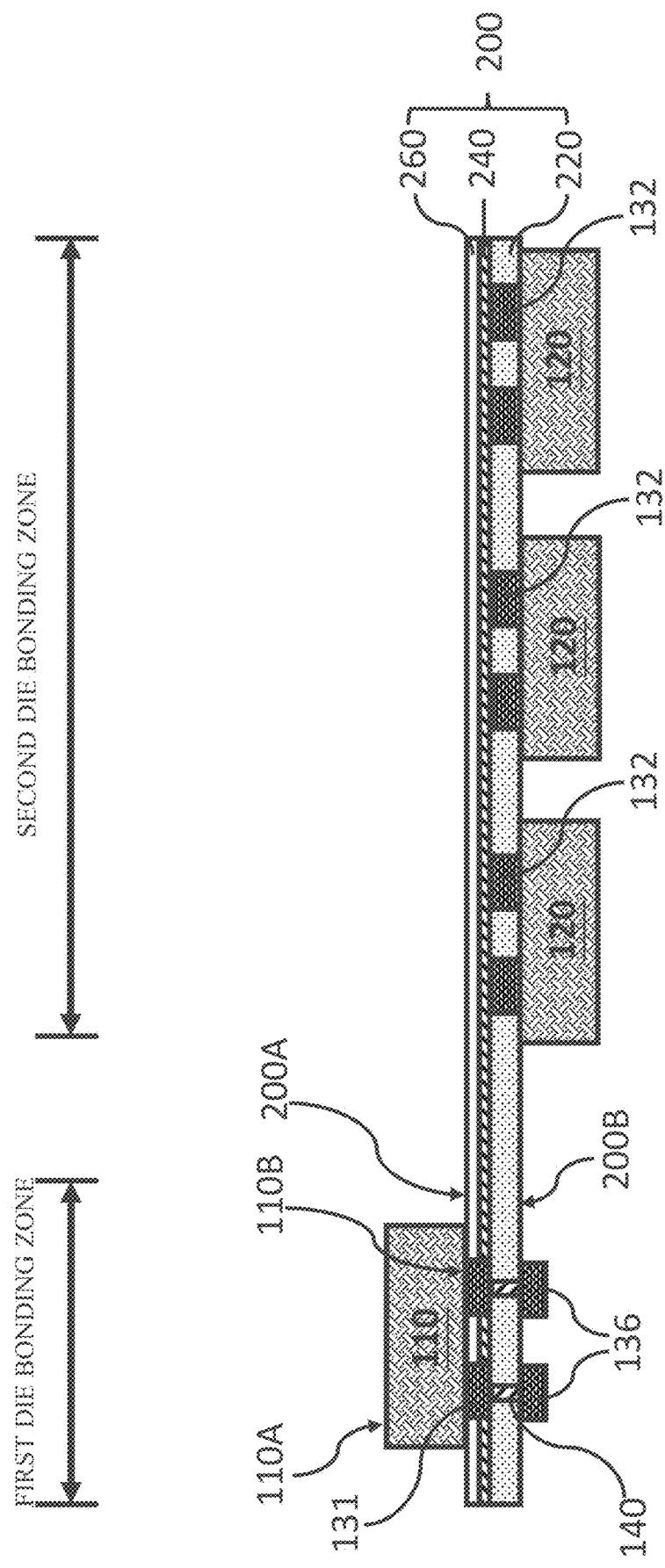
Figure 1B:
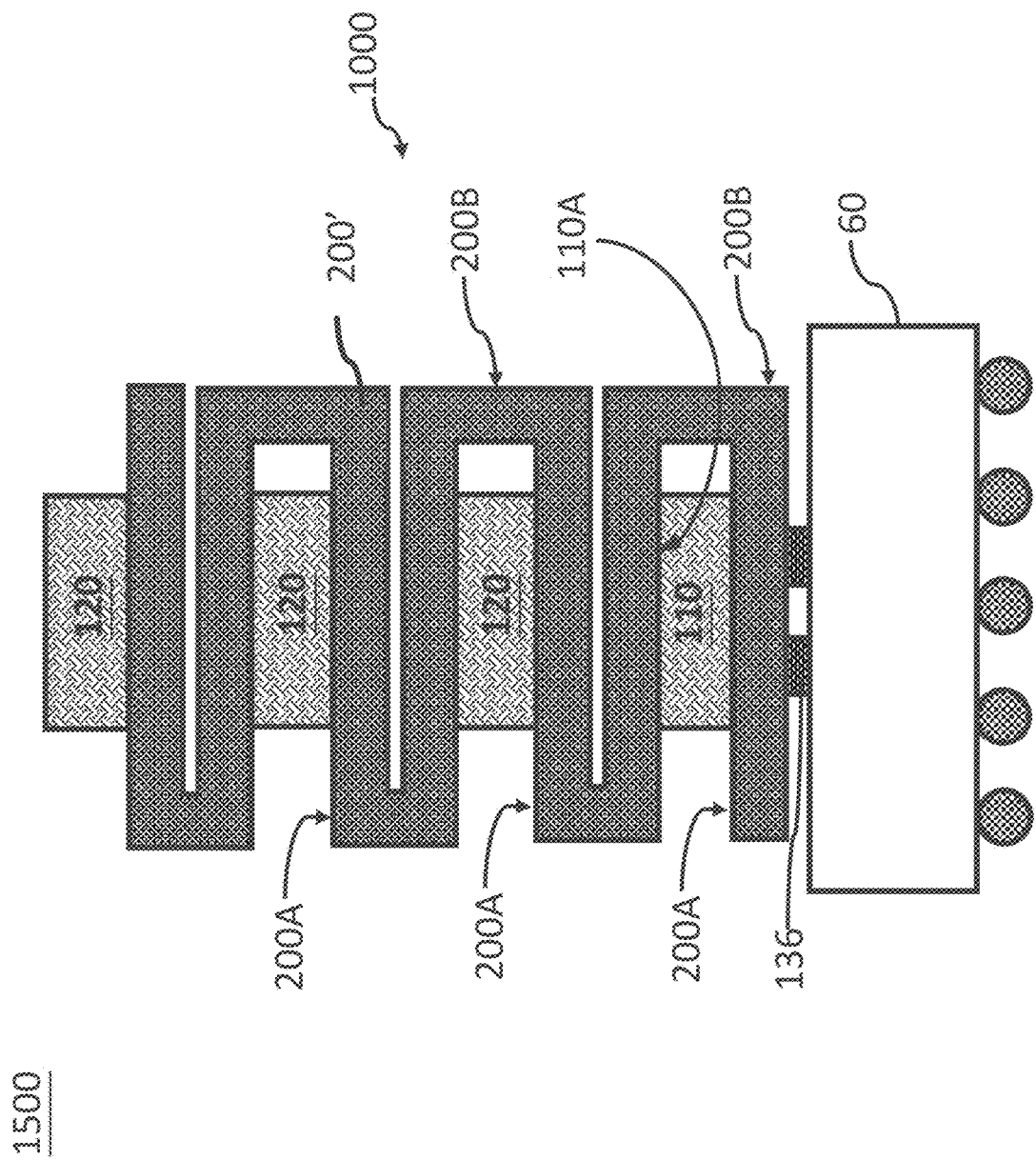
Figure 1B:
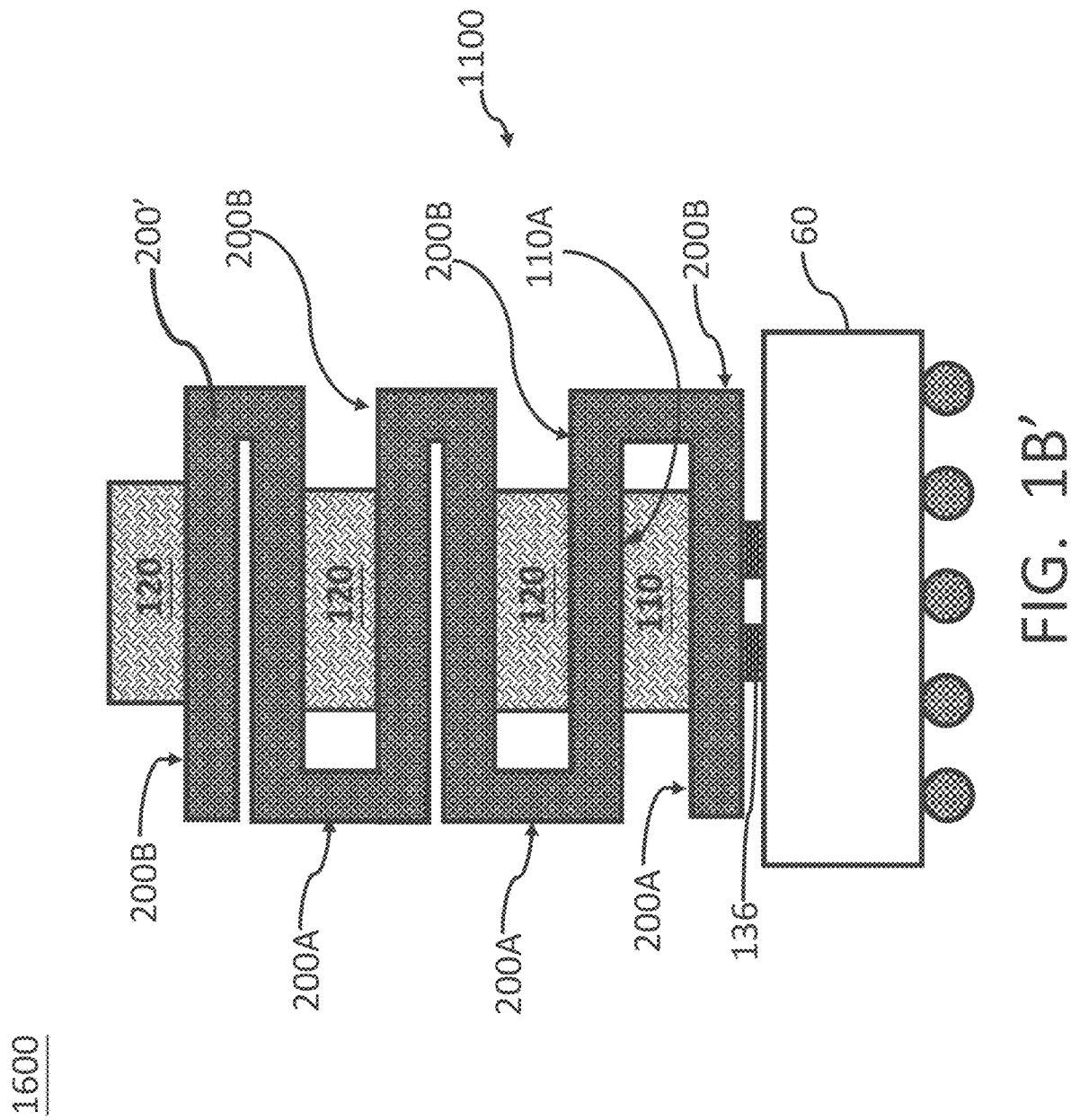

Please refer to FIGS. 1A~1B. FIGS. 1A~1B are cross-sectional views showing processes for manufacturing a 3D package configuration 1500 according to Embodiment of this present invention.

This present Embodiment discloses a 3D package configuration 1500 as shown in FIG. 1B, comprising a package substrate 60 and a folded flexible circuit board structure 1000 vertically stacked on the package substrate 60 and electrically connected therewith. The folded flexible circuit board structure 1000 comprises: a folded flexible circuit board 200' formed by folding a strip-shaped flexible circuit board 200 as shown in FIG. 1A comprising a strip-shaped flexible insulating substrate 220, a circuit 240 formed on a surface of the strip-shaped flexible insulating substrate 220 and a strip-shaped insulating layer 260 overlaying the circuit 240, wherein the strip-shaped flexible circuit board 200 has a first surface 200A and a second surface 200B opposite to each other, and the first surface 200A includes a first die bonding zone and a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of package substrate bonding pads 136, wherein each of the package substrate bonding pads 136 corresponding to each of the first die bonding pads 131 is electrically connected to each other through a first conductive hole 140; a first semiconductor die 110 bonded to the first die bonding zone and electrically connected to the circuit 240 through the first die bonding pads 131; and a plurality of second semiconductor dies 120 bonded to the second die bonding zones and electrically connected to the circuit 240 through the second die bonding pads 132.

According to this present Embodiment, the package substrate 60 can be for example but not limited to a lead frame, a Ball Grid Array (BGA) package substrate including a ceramic BGA package substrate, a plastic BGA package substrate, a metal BGA package substrate and a tape BGA package substrate, a Chip Scale Package (CSP) substrate or a Flip Chip (FC) package substrate.

As shown in FIGS. 1A~1B, the folded flexible circuit board structure 1000 as shown in FIG. 1B was obtained by folding the strip-shaped flexible circuit board 200 shown in FIG. 1A to make the second semiconductor dies 120 be vertically and sequentially stacked above the first semiconductor die 110. The obtained folded flexible circuit board structure 1000 was vertically stacked on the package substrate 60 and electrically connected therewith by the package substrate bonding pads 136, and then placed into a jig for subsequent package treatment to generate a 3D package configuration 1500 as shown in FIG. 1B.

According to other Embodiment of this invention, the folded flexible circuit board 200 shown in FIG. 1B can be replaced by another folded flexible circuit board 200' as shown in FIG. 1B' obtained by folding the strip-shaped flexible circuit board 200 comprising a strip-shaped flexible insulating substrate 220, a circuit 240 formed on a surface of the strip-shaped flexible insulating substrate 220 and a strip-shaped insulating layer 260 overlaying the circuit 240 as shown in FIG. 1A', wherein the second die bonding zones with second semiconductor dies 120 bonded thereto of the strip-shaped flexible circuit board 200 were concurrently formed on the second surface 200B. Therefore, another 3D package configuration 1600 comprising a package substrate 60 and a folded flexible circuit board structure 1100 vertically stacked on the package substrate 60 and electrically connected therewith through package substrate bonding pads 136 thereof as shown in FIG. 1B' was obtained.

According to other Embodiment of this invention, the folded flexible circuit board 200 shown in FIG. 1B can also be replaced by another folded flexible circuit board 200" as shown in FIG. 1B" obtained by folding the strip-shaped flexible circuit board 200 comprising a strip-shaped flexible insulating substrate 220, a circuit 240 formed on a surface of the strip-shaped flexible insulating substrate 220 and a strip-shaped insulating layer 260 overlaying the circuit 240 as shown in FIG. 1A", wherein the second die bonding zones with second semiconductor dies 120 bonded thereto of the strip-shaped flexible circuit board 200 were alternatively formed on the first surface 200A and the second surface 200B. Therefore, another 3D package configuration 1700 comprising a package substrate 60 and a folded flexible circuit board structure 1200 vertically stacked on the package substrate 60 and electrically connected therewith through package substrate bonding pads 136 thereof as shown in FIG. 1B" was obtained.

Each of the strip-shaped flexible circuit boards 200 shown in 1A, 1A' or 1B" according to Embodiment of this invention comprises one first semiconductor die 110 bonded to the first die bonding zone. However, the flexible circuit boards 200 shown in 1A, 1A' or 1B" according to other Embodiments of this invention can alternatively comprise more than one first semiconductor dies 110 bonded to the first die bonding zone if necessary.

A plurality of second semiconductor dies 120 were bonded to the second die bonding zone formed on the first surface 200A and/or the second surface 200B. However, according to another Embodiment of this invention, one second semiconductor die 120 can also optionally be bonded to the second die bonding zone formed on the first surface 200A or the second die bonding zone if necessary.

The first semiconductor die 110 and the second semiconductor die 120 of the 3D package configurations 1500, 1600 and 1700 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the package substrate bonding pads 136 of the 3D package configurations 1500, 1600 and 1700 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the strip-shaped flexible insulating substrates 220 is selected from for example but not limited to one of the group consisting of Polyester resin, Polyimide (PI), Modified Polyimide (MPI), Covalent Organic Framework (COF), Liquid Photo-Imagable (LPI), Liquid Crystal Polymer (LCP), Polytetrafluoroethylene (PTFE) and flexible epoxy bonded fiber-glass board, or combinations thereof.

The material for the circuit 240 is selected from for example but not limited to one of the group consisting of copper, copper alloy, tinned copper, tin alloy, aluminum, aluminum alloys, gold and silver, or combinations thereof.

The circuit 240 can be a single-layered circuit or a multiple-layered circuit, and the strip-shaped insulating layer 260 overlaying the circuit 240 can also be a single-layered insulating layer or a multiple-layered insulating layer.

According to another Embodiment of this invention, additional adhesive layers can be coated on the first surface 200A of the strip-shaped flexible circuit boards 200, 200' and 200", or the second surface 200B of the strip-shaped flexible circuit boards 200, 200' and 200" to respectively fasten the folded flexible circuit board structure 1500, 1600 or 1700 vertically stacked on the package substrate 60.

As described in the above Embodiment, a novel 3D package configuration can be obtained by stacking a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies such as CPU dies, GPU dies, DRAM dies, SRAM dies, telecommunication dies, standard logic IC dies, ASIC dies, various sensing IC dies, various driving IC and other semiconductor dies with various functions be bonded on one die and/or two side of a flexible circuit board and electrically connected therewith in advance.

Although particular Embodiments have been shown and described, it should be understood that the above discussion is not intended to limit the present invention to these Embodiments. Persons skilled in the art will understand that various changes and modifications may be made without departing from the scope of the present invention as literally and equivalently covered by the following claims.

What is claimed is:

1. A 3D package configuration, comprising:
   a package substrate; and
   a folded flexible circuit board structure vertically stacked on the package substrate and electrically connected therewith through package substrate bonding pads thereof, comprising:
   a folded flexible circuit board formed by folding a strip-shaped flexible circuit board, wherein the strip-shaped flexible circuit board comprises a first surface and a second surface opposite to each other, and the strip-shaped flexible circuit board includes a first die bonding zone and at least one second die bonding zone;
   at least one first semiconductor die bonded to the first die bonding zone and electrically connected to the strip-shaped flexible circuit board; and
   at least one second semiconductor die bonded to the at least one second die bonding zone and electrically connected to the strip-shaped flexible circuit board;
   wherein, the at least one second semiconductor die is vertically stacked above the at least one first semiconductor die;
   wherein the strip-shaped flexible circuit board comprises:
   a strip-shaped flexible insulating substrate;
   a circuit formed on a surface of the strip-shaped flexible insulating substrate; and
   a strip-shaped insulating layer overlaying the circuit;
   wherein, the first die bonding zone comprises a plurality of first die bonding pads electrically connected to the circuit to make the first semiconductor die electrically connected to the circuit through the first die bonding pads, and the at least one second die bonding zone comprises a plurality of second die bonding pads electrically connected to the circuit to make the at least one second semiconductor die electrically connected to the circuit through the second die bonding pads, and a plurality of package substrate bonding pads under the first die bonding zone are formed on the second surface of the strip-shaped flexible circuit board, and each of the package substrate bonding pads is electrically connected to each of the first die bonding pads corresponding thereof through a conductive hole.

2. The 3D package configuration as claimed in claim 1, comprising a plurality of second semiconductor dies spaced with each other, and a plurality of second die bonding zones formed on the first surface and/or the second surface of the strip-shaped flexible circuit board, wherein each of the second semiconductor dies is bonded on each of the second semiconductor die bonding zones and electrically connected to the strip-shaped flexible circuit board through second die bonding pads in each of the second die bonding zones, and the second semiconductor die are vertically and sequentially stacked above the at least one first semiconductor die, and the first die bonding zone overlaps with the second die bonding zones.

3. The 3D package configuration as claimed in claim 1, wherein the second die bonding zones are concurrently formed on the first surface of the strip-shaped flexible circuit board or concurrently formed on the second surface of the strip-shaped flexible circuit board.

4. The 3D package configuration as claimed in claim 1, wherein the second die bonding zones are alternatively formed on the first surface and the second surface of the strip-shaped flexible circuit board.

5. The 3D package configuration as claimed in claim 1, wherein the material of the strip-shaped flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

6. The 3D package configuration as claimed in claim 1, wherein the material of the circuit is selected from one of the group consisting of copper, copper alloy, tinned copper, tin alloy, aluminum, aluminum alloys, gold and silver, or combinations thereof.

* * * * *